United States Patent
Moriyama

(10) Patent No.: US 9,932,688 B2
(45) Date of Patent: Apr. 3, 2018

(54) METHOD FOR PRODUCING GROUP III NITRIDE SEMICONDUCTOR SINGLE CRYSTAL

(71) Applicant: TOYODA GOSEI CO., LTD., Kiyosu-shi (JP)

(72) Inventor: Miki Moriyama, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/239,584

(22) Filed: Aug. 17, 2016

(65) Prior Publication Data

US 2017/0058425 A1  Mar. 2, 2017

(30) Foreign Application Priority Data

Aug. 26, 2015 (JP) .................................. 2015-167169
Aug. 3, 2016 (JP) .................................. 2016-152819

(51) Int. Cl.
| | |
|---|---|
| *C30B 9/12* | (2006.01) |
| *H01L 21/66* | (2006.01) |
| *C30B 29/40* | (2006.01) |
| *H01L 21/02* | (2006.01) |

(52) U.S. Cl.
CPC ............. *C30B 9/12* (2013.01); *C30B 29/406* (2013.01); *H01L 22/20* (2013.01); *H01L 21/0242* (2013.01); *H01L 21/0254* (2013.01); *H01L 21/02458* (2013.01)

(58) Field of Classification Search
CPC combination set(s) only.
See application file for complete search history.

(56) References Cited

U.S. PATENT DOCUMENTS

2004/0262630 A1* 12/2004 Kitaoka ............ H01L 21/02389
257/189
2012/0125255 A1* 5/2012 Saito ........................ C30B 9/00
117/78

FOREIGN PATENT DOCUMENTS

JP    2010-168236 A    8/2010

* cited by examiner

*Primary Examiner* — Duy Vu N Deo
*Assistant Examiner* — Erin F Bergner
(74) *Attorney, Agent, or Firm* — McGinn IP Law Group, PLLC

(57) ABSTRACT

The present techniques provide a method for producing a Group III nitride semiconductor single crystal that is designed to grow a semiconductor single crystal with high reproducibility. The method for producing a Group III nitride semiconductor single crystal comprises adding a seed crystal substrate, Ga, and Na into a crucible, and growing a Group III nitride semiconductor single crystal. In the growth of the Group III nitride semiconductor single crystal, a measuring device is used to detect the reaction of Ga with Na. Ga is reacted with Na with the temperature of the crucible adjusted within a first temperature range of 80° C. to 200° C. After the measuring device detected the reaction of Ga with Na, the temperature of the crucible is elevated up to a growth temperature of the Group III nitride semiconductor single crystal.

16 Claims, 7 Drawing Sheets

METHOD FOR PRODUCING GROUP III NITRIDE SEMICONDUCTOR SINGLE CRYSTAL

BACKGROUND OF THE INVENTION

Filed of the Invention

The techniques of the present specification relates to a method for producing a Group III nitride semiconductor single crystal through a flux method.

Background Art

Semiconductor crystals are produced through vapor-phase growth methods such as metal-organic chemical vapor deposition (MOCVD) and hydride vapor phase epitaxy (HVPE); molecular beam epitaxy (MBE); and liquid-phase epitaxy. One liquid-phase epitaxy technique is a flux method employing Na flux.

In a general procedure of the flux process, a gallium nitride (GaN) layer is formed on a sapphire substrate or a like substrate, to thereby form a seed-crystal substrate, and a semiconductor single crystal is grown on the seed-crystal substrate in a melt. The seed-crystal substrate, raw materials of the semiconductor single crystal, and a flux are placed in a crucible, and then the semiconductor single crystal is grown while the temperature and pressure in the reaction chamber are controlled. There is disclosed a technique for transferring nitrogen gas from the vapor-liquid interface into the melt through stirring the melt (refer to, for example, paragraph [0003], Table 1, etc. of Japanese Patent Application Laid-Open (kokai) No. 2010-168236).

When semiconductor single crystals are grown through a flux method, semiconductor single crystals are sometimes not grown depending on the growth conditions. Even when semiconductor single crystals could be grown, it is difficult to obtain uniform semiconductor single crystals over the entire surface of the seed crystal substrate. Reproducibility of semiconductor single crystals is sometimes unstable. That is, it is by no means easy to stably grow semiconductor single crystals.

SUMMARY OF THE INVENTION

The present techniques have been accomplished for solving the aforementioned problems involved in conventional techniques. Thus, an object of the present techniques is to provide a method for producing a Group III nitride semiconductor single crystal with high reproducibility.

Accordingly, in a first aspect of the present techniques, there is provided a method for producing a Group III nitride semiconductor single crystal comprising adding a seed-crystal substrate, Ga, and Na into a crucible and growing a Group III nitride semiconductor single crystal. In the growth of the Group III nitride semiconductor single crystal at a predetermined growth temperature, Ga is reacted with Na with the temperature of the crucible adjusted within a first temperature range lower than 500° C. After the reaction of Ga with Na, the temperature of the crucible is elevated up to the growth temperature of the Group III nitride semiconductor single crystal.

A second aspect of the present techniques is drawn to a specific embodiment of the method for producing a Group III nitride semiconductor single crystal, wherein the reaction of Ga and Na is a state of a dispersion of fine particles of Ga—Na alloy.

The first temperature range is preferably 80° C. to 400° C., and further preferably, 80° C. to 200° C. The inventors of the present inventions found that achieving a reaction of Ga and Na in a melt, i.e., a state of a dispersion of fine particles of Ga—Na alloy, before the semiconductor is grown greatly contributes to melt-back or generation of nuclei during the growth. In the conventional techniques, high quality crystal was not obtained because of a small generation amount of fine particles of Ga—Na alloy before the growth. When the temperature is maintained in a range lower than 500° C. or the temperature rise rate is lowered in the temperature range, alloying of Ga and Na is promoted. After that, high quality crystal growth is achieved by elevating the temperature up to the growth temperature and growing a semiconductor. A large amount of fine particles of Ga—Na alloy is generated even in a temperature range of 80° C. to 400° C. However, a large amount of fine particles can be certainly generated in a temperature range of 80° C. to 200° C. so that the highest quality semiconductor crystal can be grown.

A third aspect of the present techniques is drawn to a specific embodiment of the method for producing a Group III nitride semiconductor single crystal, wherein the reaction of Ga with Na is detected by a measuring device for detecting the reaction of Ga with Na in the first and second aspects of the present techniques.

In the method for producing a Group III nitride semiconductor single crystal, Ga is sufficiently reacted with Na. The Ga—Na alloy is uniformly dispersed in a melt. A Group III nitride semiconductor single crystal is uniformly formed over the entire surface of the seed crystal substrate. The semiconductor single crystal also has a high yield rate. When the reaction of Ga with Na is insufficient, thermal treatment is continued until sufficient reaction is confirmed within the first temperature range. To promote the reaction of Ga with Na, extension of thermal treatment time, stirring, pressure change, and control of furnace atmosphere may be carried out.

A fourth aspect of the present techniques is drawn to a specific embodiment of the method for producing a Group III nitride semiconductor single crystal, wherein the measuring device is a X-ray observation device which observes the inside of the crucible by transmitting X-ray to the crucible in the third aspect of the present techniques. The measuring device detects the reaction of Ga with Na by receiving the X-ray transmitted through the crucible.

A fifth aspect of the present techniques is drawn to a specific embodiment of the method for producing a Group III nitride semiconductor single crystal, wherein the measuring device has a temperature measuring unit which measures the inside temperature of the crucible and detects the reaction of Ga with Na in differential thermal analysis in the third aspect of the present techniques.

A sixth aspect of the present techniques is drawn to a specific embodiment of the method for producing a Group III nitride semiconductor single crystal, wherein in the growth of a Group III nitride semiconductor single crystal, the temperature of the crucible is adjusted so as to fall within the first temperature range for at least 30 minutes in the first to fifth aspects of the present techniques.

A seventh aspect of the present techniques is drawn to a specific embodiment of the method for producing a Group III nitride semiconductor single crystal, wherein the temperature rise rate at which the temperature of the crucible is elevated from a room temperature to a temperature when the reaction of Ga and Na is completed is lower than the temperature rise rate at which the temperature of the crucible is elevated up to the growth temperature after the reaction in the first to fifth aspects of the present techniques.

The present techniques, disclosed in the specification, provide a method for producing a Group III nitride semiconductor single crystal with high reproducibility.

BRIEF DESCRIPTION OF THE DRAWINGS

Various other objects, features, and many of the attendant advantages of the present technique will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
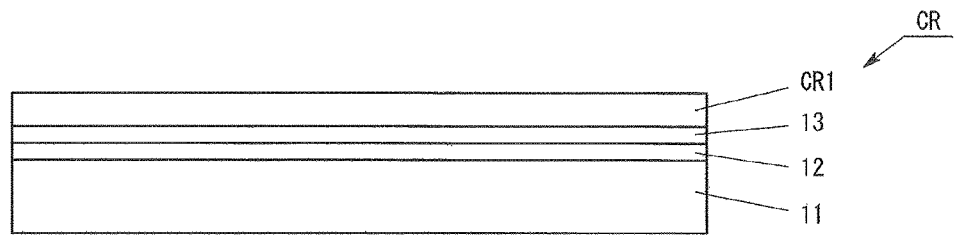
FIG. 1 is a schematic view of a Group III nitride semiconductor single crystal of Embodiments 1 to 3.

Specific embodiments of the present technique will next be described with reference to the drawings. The embodiments relate to a method for producing a Group III nitride semiconductor single crystal based on a flux process, and a semiconductor device produced through the method. These elements described in the embodiments are given for the only illustration purpose, and the present technique is not limited to the embodiments. The thickness of each layer which is schematically shown in the drawings does not correspond to its actual value.

Embodiment 1

1. Semiconductor Single Crystal

FIG. 1 shows a crystal CR of Embodiment 1. As shown in FIG. 1, the crystal CR has a sapphire substrate 11, a buffer layer 12, a GaN layer 13, and a single crystal CR1. The single crystal CR1 is formed of a Group III nitride semiconductor. The single crystal CR1 is obtained by removing the sapphire substrate 11 and the other layers from the crystal CR.

2. Crystal Growth Apparatus 2-1. Structure of Crystal Growth Apparatus

Figure 2:
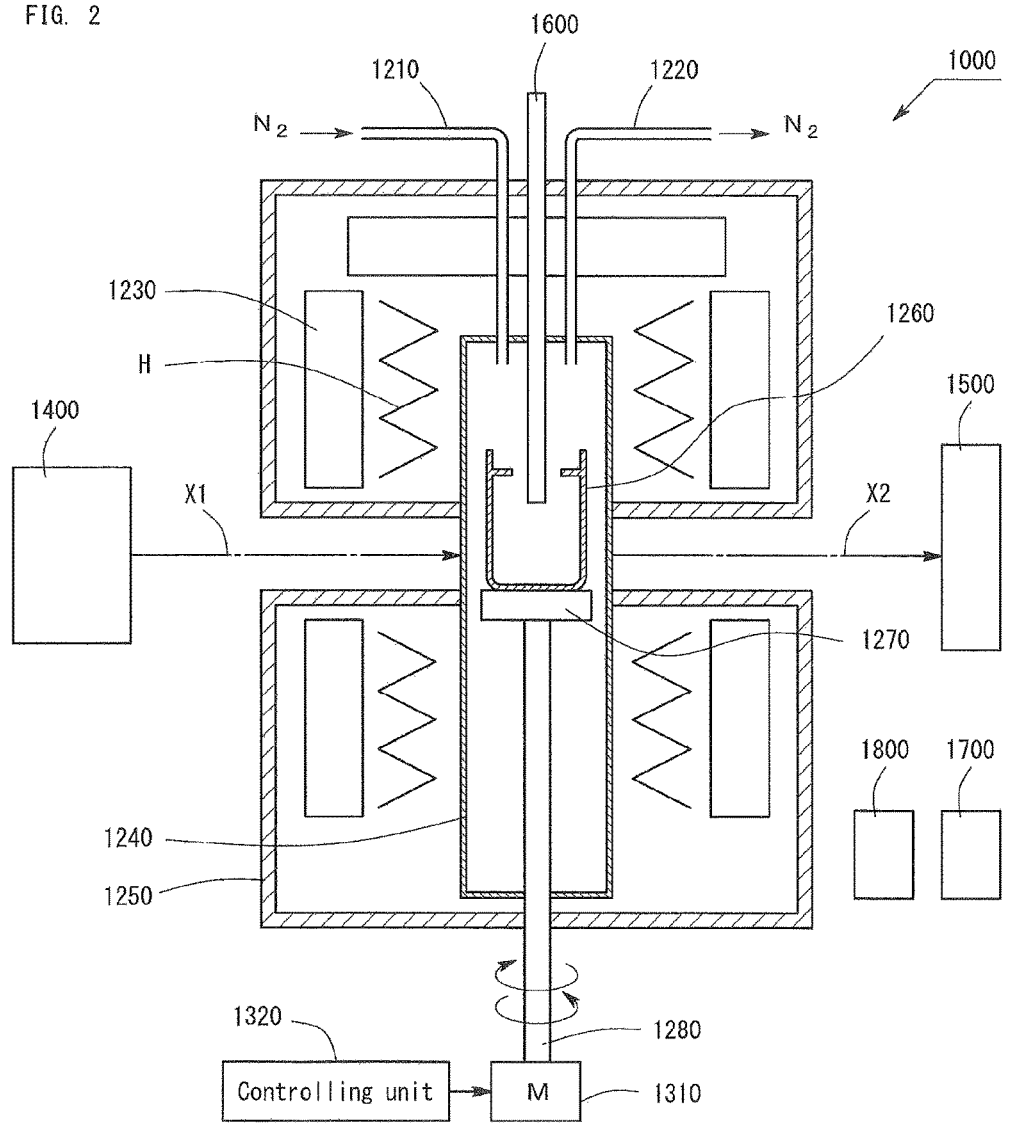
FIG. 2 is a schematic view illustrating the structure of a crystal growth apparatus for producing the Group III nitride semiconductor single crystal of Embodiment 1.

FIG. 2 shows a crystal growth apparatus 1000 to produce the crystal CR of Embodiment 1. The crystal growth apparatus 1000 is employed for growth of a Group III nitride semiconductor single crystal on a growth substrate through a Na flux process. As shown in FIG. 2, the crystal growth apparatus 1000 has a gas-feed pipe 1210, a gas-discharge pipe 1220, a thermal insulator 1230, a reaction chamber 1240, a pressure container 1250, a turntable 1270, a rotary shaft 1280, a motor 1310, a motor controlling unit 1320, a X-ray irradiation unit 1400, a X-ray receiving unit 1500, a temperature measuring unit 1600, a reaction determination unit 1700, a heater H, and a heater controlling unit 1800.

As shown in FIG. 2, in the crystal growth apparatus 1000, a crucible 1260 can be placed on the turntable 1270. The crucible 1260 can be simultaneously rotated with the turntable 1270. The rotation center corresponds to the rotary shaft 1280. The rotation speed of the crucible 1260 may be regulated by regulating rotation of the motor 1310. In the crystal growth apparatus 1000, the crucible 1260, in addition to be rotated, may be vibrated or rocked, thereby stirring the raw materials.

The pressure container 1250 is adapted to accommodate the reaction chamber 1240. The pressure container 1250 is made of a material such as SUS. Needless to say, other materials may also be employed. The reaction chamber 1240 is adapted to accommodate the crucible 1260 and provides conditions for growth of a semiconductor single crystal.

The gas-feed pipe 1210 is disposed for supplying nitrogen gas ($N_2$) into the reaction chamber 1240. The gas-discharge pipe 1220 is disposed for discharging nitrogen gas ($N_2$) from the reaction chamber 1240. The inside pressure of the reaction chamber 1240 can be tuned by means of the two pipes. The heater H is disposed to heat the inside of the pressure container 1250 and the inside of the reaction chamber 1240. The heater H can also control the inside temperature of the reaction chamber 1240. The thermal insulator 1230 serves as a member that can prevent diffusion of heat from the inside of the reaction chamber 1240 to the outside. Any gas other than nitrogen, such as Ar, may be supplied to control the pressure or atmosphere in the furnace.

The turntable 1270 serves as a base on which the crucible 1260 is placed. Thus, the turntable 1270 is disposed in the reaction chamber 1240. The crucible 1260 is made of alumina. Or the crucible 1260 may be made of other material transmitting X-ray and having heat resistance. The rotary shaft 1280 sustains the turntable 1270 and transfers the power of the motor 1310 to the turntable 1270. The rotary shaft 1280 receives the driving force of the motor 1310 and serves as a rotation center.

The motor 1310 serves as a rotational driving member for rotating the rotary shaft 1280. The motor controlling unit 1320 controls rotation of the motor 1310. The motor controlling unit 1320 controls the direction of rotation of the motor 1310 as well as the rotation speed of the motor 1310, and increase and decrease of the rotation speed of the motor 1310. In other words, the motor controlling unit 1320 controls the rotation of the crucible 1260 according to the rotational mode described hereinbelow.

The X-ray irradiation unit 1400 is adapted to generate X ray and irradiate the crucible 1260 with X ray X1 on the turntable 1270. The X-ray receiving unit 1500 is adapted to receive X ray X2 transmitted through the crucible 1260. The X-ray receiving unit 1500 forms a X-ray image from the X ray transmitted through the crucible 1260.

The temperature measuring unit 1600 is adapted to measure the inside temperature of the crucible 1260. The reaction determination unit 1700 is adapted to determine the reaction state of Ga with Na based on the X-ray image obtained by the X-ray receiving unit 1500. The reaction determination unit 1700 performs differential thermal analysis from the temperature of the crucible 1260 measured by the temperature measuring unit 1600.

The heater controlling unit 1800 is adapted to control the heating level of the heater H. The heater controlling unit 1800 controls the heating level of the heater H according to the reaction state of Ga with Na observed by the X-ray receiving unit 1500. The heater controlling unit 1800 controls the heating level of the heater H according to the temperature of the crucible 1260 measured by the temperature measuring unit 1600.

The crystal growth apparatus 1000 may have a device to monitor the atmosphere in the furnace. Such a device includes a gas monitor such as quadrupole type mass spectrometer and oxygen concentration meter.

2-2. Operation of Crystal Growth Apparatus

The crystal growth apparatus 1000 monitors the state in the crucible 1260 as well as grows a single crystal CR1 in the crucible 1260. Monitoring is performed using the X-ray irradiation unit 1400, the X-ray receiving unit 1500, and the temperature measuring unit 1600.

2-2-1. Observation by X Ray

The X-ray irradiation unit 1400 irradiates the crucible 1260 containing the raw materials with the X ray X1. The X-ray receiving unit 1500 receives the X ray X2 transmitted through the crucible 1260. The X-ray receiving unit 1500 performs image processing of the transmitted X ray X2. The X-ray images may be separately displayed on a display or the like. Thus, the X-ray receiving unit 1500 can output the X-ray images which are temporally continuously changed.

The X-ray receiving unit 1500 can monitor the reaction state of Ga with Na in the crucible 1260. The crystal growth apparatus 1000 or an operator determines whether Ga was reacted with Na. The operator determines that Ga was reacted with Na by visually checking the X ray. The reaction determination unit 1700 of the crystal growth apparatus 1000 determines that Ga was reacted with Na when the obtained X-ray image is close to the pattern shown in the photograph of the reaction of Ga with Na, and determines that Ga was not reacted with Na when the obtained X ray image is not close to the pattern shown in the photograph of the reaction of Ga with Na.

2-2-2. Differential Thermal Analysis

The temperature measuring unit 1600 measures the inside temperature of the crucible 1260. The reaction determination unit 1700 of the crystal growth apparatus 1000 obtains the measured temperature value of the crucible 1260 and the reference temperature value based on the setting value of the heater controlling unit 1800. The reference temperature value may be stored in memory or the like in advance. The reaction determination unit 1700 determines whether Ga was reacted with Na in the crucible 1260 from the differential thermal analysis.

Figure 3:
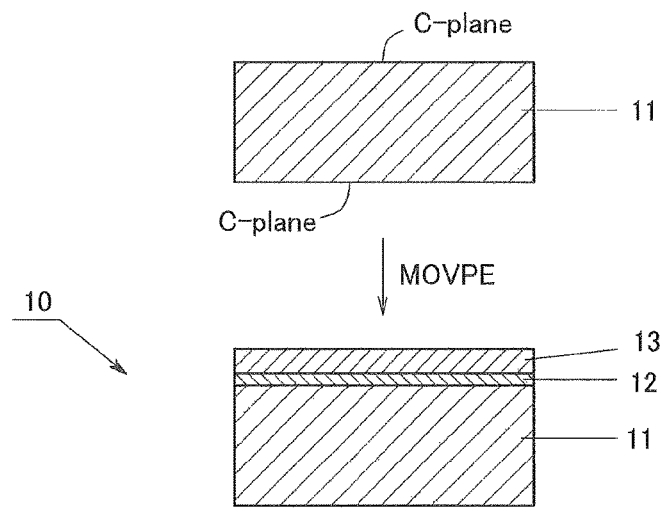
FIG. 3 is a schematic view showing a method for forming a seed crystal substrate employed in the method for producing a Group III nitride semiconductor single crystal of Embodiment 1.

3. Method for Producing Group III Nitride Semiconductor Single Crystal 3-1. Forming Seed Crystal Substrate The method for producing a semiconductor single crystal will next be described. As shown in FIG. 3, preparation of a template 10 will be described. The template 10 is a seed crystal substrate used for growth of a semiconductor single crystal through a flux process. Firstly, a sapphire substrate 11 is provided. Through MOCVD, a buffer layer 12 is formed on the c-plane of the sapphire substrate 11. The buffer layer 12 is formed from a material such as AlN. The buffer layer 12 may be formed of TiN or GaN. A self-standing GaN crystal may be used as the template 10.

On the buffer layer 12, a GaN layer 13 is formed, to thereby prepare the template 10. The buffer layer 12 and the GaN layer 13 serve as a seed layer. However, when a GaN self-standing substrate (wafer) is used, no buffer layer 12 is required to be formed. The GaN layer 13, which is a GaN layer in this embodiment, may also be formed of AlGaN, InGaN, or AlInGaN. The GaN layer 13 undergoes melt-back in the flux under certain growth conditions. In this case, a portion of the GaN layer 13 dissolves in the flux.

3-2. Growing Semiconductor Single Crystal

Next, a semiconductor single crystal layer is formed on the template 10 through the flux process, which is a type of liquid-phase epitaxy. Table 1 shows raw materials employed for growth of the semiconductor single crystal. The carbon ratio may vary within a range of 0 mol % to 2.0 mol %. That is, the flux may or may not optionally contain carbon. The values shown in Table 1 are only an example, and other values may be applied. In addition to these elements, a dopant element may be added.

The semiconductor single crystal to be grown is a Group III nitride semiconductor single crystal, such as GaN. Firstly, the template 10 and the raw materials shown in Table 1 are weighed in a glove box in which dew point and oxygen concentration are controlled. Subsequently, the template 10, and Ga and Na are added into the crucible 1260. Then, the crucible 1260 is placed on the turntable 1270 of the reaction chamber 1240. Thereafter, the pressure container 1250 is evacuated, and then the pressure and temperature in the container are elevated. While the crucible 1260 is rotated, a semiconductor single crystal is grown. Any stirring method may be employed at any timing. Therefore, a semiconductor single crystal may be grown without stirring. Whether stirring is performed or not may be changed during the growth.

[Table 1]

Raw material Raw material amount

Ga 1 g

Na 1.4 g

C 0 mol % to 2.0 mol % (with respect to Na)

Table 2 shows conditions in the crucible employed for growth of a semiconductor single crystal. The growth temperature of the semiconductor single crystal is adjusted to, for example, 870° C., and the pressure is adjusted to, for example, 3 MPa. The growth time is about 20 hours to 200 hours.

[Table 2]

Temperature Approx. 700° C. to 900° C.

Pressure 3 MPa to 10 MPa

Stirring speed 0 rpm to 100 rpm

Growth time 20 to 200 hours

4. Rotational Mode of Crucible

Figure 4:
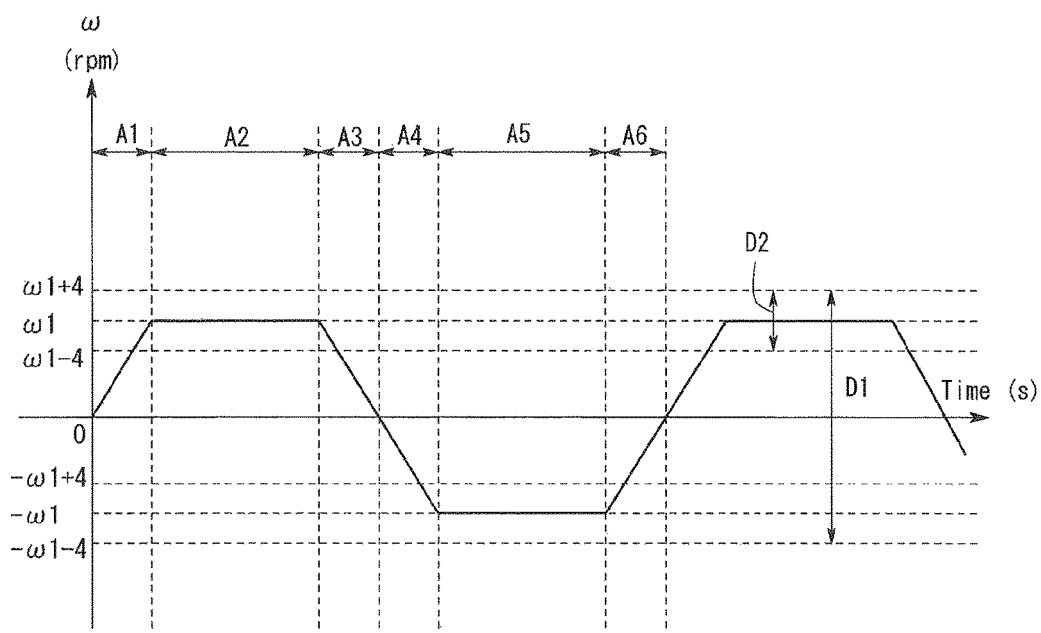
FIG. 4 is a graph showing the rotational mode of the crucible in the growth of a semiconductor single crystal in included in the method for producing a Group III nitride semiconductor single crystal of Embodiments 1 and 2.

The rotational mode of the crucible 1260 employed in Embodiment 1 is shown in FIG. 4. As shown in FIG. 4, the rotational mode of the crucible 1260 includes alternating repetition of forward rotation and reverse rotation. In the present specification, the rotation speed of the crucible 1260 in the forward direction is represented with a sign "+", and that in the reverse direction with a sign "−".

As shown in FIG. 4, the stirring period includes an acceleration period A1, a constant speed rotation (forward direction) period A2, a speed reduction period A3, an acceleration period A4, a constant speed rotation (reverse direction) period A5, and a speed reduction period A6. In the growth of a semiconductor single crystal, the cycle is continuously performed. As used herein, the term "acceleration" refers to increasing the absolute value of the rotation speed of the crucible 1260, and the term "speed reduction" refers to reducing the absolute value of the rotation speed of the crucible 1260.

In the acceleration period A1, the rotation speed ω of the crucible 1260 is increased to a rotation speed ω1. In the constant speed forward rotation period A2, the crucible 1260 is rotated at a constant speed ω1. In the speed reduction period A3, the rotation speed ω of the crucible 1260 is reduced from the rotation speed ω1. In the acceleration period A4, the rotation speed ω of the crucible 1260 is increased to a rotation speed −ω1. In the constant speed reverse rotation period A5, the crucible 1260 is rotated at a constant speed −ω1. In the speed reduction period A6, the rotation speed ω of the crucible 1260 is reduced from the rotation speed −ω1.

5. Temperature Profile of Melt

Figure 5:
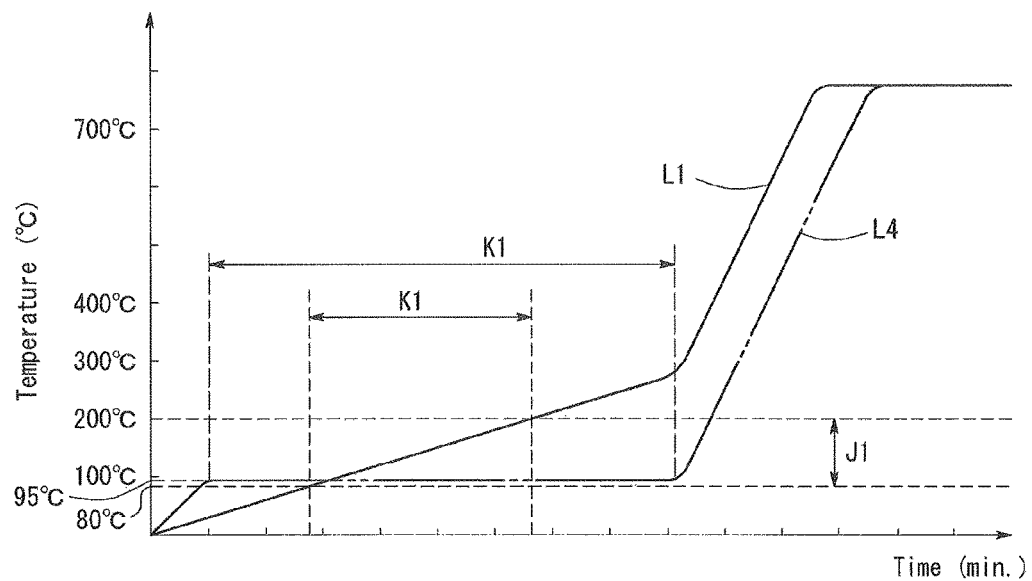
FIG. 5 is a graph showing the temperature profile in the method for producing a Group III nitride semiconductor single crystal of Embodiments 1 and 2.

FIG. 5 is a graph showing the temperature profile of the melt in the crucible 1260 of Embodiment 1. As shown in FIG. 5, in Embodiment 1, the inside temperature of the crucible 1260 is adjusted to the first temperature range J1 during the first period K1. The first period K1 is 20 minutes to 70 minutes. Preferably, the first period K1 is 30 minutes to 60 minutes. The first temperature range J1 is 80° C. to 200° C. That is, the temperature of the crucible 1260 is kept within the first temperature range J1 for 30 minutes or more.

As described hereinbelow, when the inside temperature of the crucible 1260 is within the first temperature range J1, Ga is reacted with Na. It is supposed that Ga and Na are reacted each other, to thereby form fine particles of Ga—Na alloy. That is, the completion of the reaction is a state of a dispersion of fine particles of Ga—Na alloy. When Ga and Na are uniformly mixed while Ga is reacted with Na, a uniform semiconductor crystal is uniformly grown. Therefore, the temperature of the crucible 1260 is adjusted within the first temperature range J1 during the first period K1.

After the reaction of Ga with Na sufficiently proceeded, the heater controlling unit 1800 increases the temperature of the heater H. The temperature of the crucible 1260 is elevated up to the growth temperature of the semiconductor single crystal.

Thus, Ga is reacted with Na within the first temperature range J1 during the first period K1, and a single crystal CR1 is grown at a growth temperature of 700° C. or more.

It is found from an experiment that there is a close relationship between the reaction state of Ga with Na within the first temperature range J1 and the growth of GaN at a high temperature thereafter. When the crucible 1260 is heated over the first temperature range J1 with insufficient reaction within the first temperature range J1, the GaN crystal may not be grown or the crystal may be abnormally grown. Therefore, to grow GaN with good reproducibility, the crucible 1260 is preferably heated up to a high temperature after sufficient reaction of Ga with Na occurred within the first temperature range J1.

6. Detection of Reaction of Ga with Na

In the growth of a semiconductor single crystal, Ga and Na are placed in the crucible 1260, and a Group III nitride semiconductor single crystal is grown. A measuring device is used to detect the reaction of Ga with Na when the Group III nitride semiconductor single crystal is grown. As described hereinbelow, Ga is reacted with Na with the temperature of the crucible 1260 adjusted within the first temperature range J1 of 80° C. to 200° C. After the measuring device detected the reaction of Ga with Na, the temperature of the crucible 1260 is elevated up to a growth temperature of the Group III nitride semiconductor single crystal. The growth temperature of the Group III nitride semiconductor single crystal is 700° C. to 950° C.

6-1. X-ray Observation Device

The measuring device is a X-ray observation device for observing the inside of the crucible 1260 by transmitting X ray through the crucible 1260. As shown in FIG. 2, the measuring device has a X-ray irradiation unit 1400, a X-ray receiving unit 1500, and a reaction determination unit 1700. The X-ray irradiation unit 1400 irradiates the crucible 1260 with the X ray X1. The X ray X2 transmitted through the crucible 1260 is received by the X-ray receiving unit 1500. The reaction determination unit 1700 detects the reaction of Ga with Na by receiving the X ray X2. Or the operator determines that Ga was reacted with Na from the obtained X-ray image.

6-2. Differential Thermal Analysis

The measuring device has a temperature measuring unit 1600, and a reaction determination unit 1700. The temperature measuring unit 1600 measures the inside temperature of the crucible 1260. Then, the reaction determination unit 1700 performs differential thermal analysis using the temperature value measured by the temperature measuring unit 1600 and the predetermined reference value. When a difference between the measured temperature value and the reference value is over a predetermined threshold value, Ga is determined to be reacted with Na. When a difference between the measured temperature value and the reference value is temporally integrated, and the integrated value is over a predetermined integrated reference value, the reaction of Ga with Na may be determined to be finished. After the reaction of Ga with Na was finished, the temperature of the crucible 1260 is preferably elevated up to the growth temperature of the semiconductor single crystal.

6-3. Temperature Control

When the Group III nitride semiconductor single crystal is grown, the temperature of the crucible 1260 is preferably within the first temperature range J1 for at least 30 minutes, thereby sufficiently proceeding the reaction of Ga with Na.

6-4. Others

To detect the reaction of Ga with Na, a change in the inside state of the crucible 1260 due to the reaction may be captured. In principle, a method such as electrical resistance measurement may be used.

7. Experiment

The experiment conducted will be described below. In this experiment, a semiconductor single crystal was grown on a seed crystal substrate under various temperature profiles.

Figure 6:
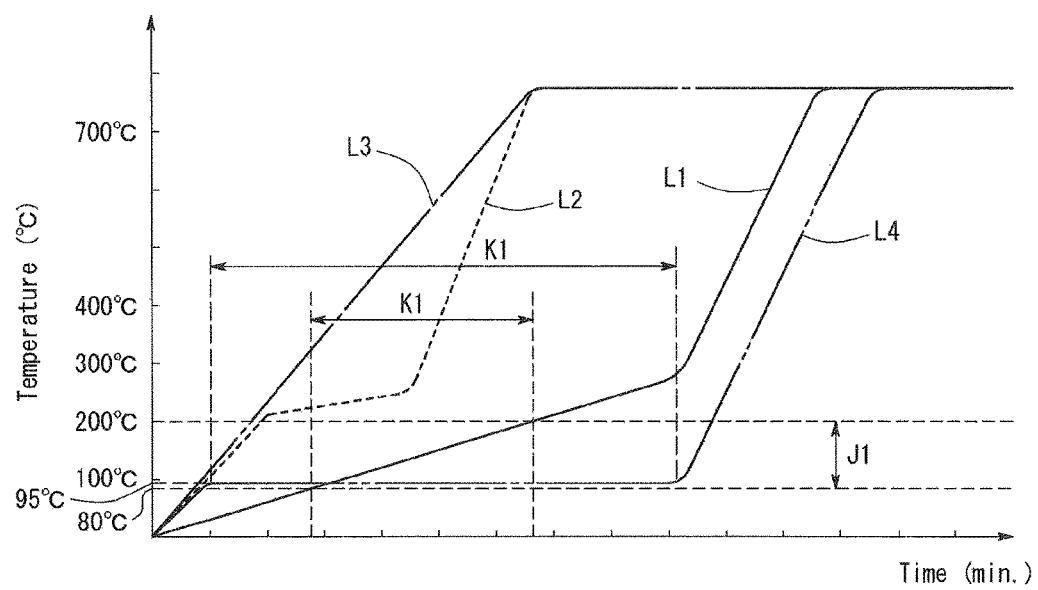
FIG. 6 is a graph showing the temperature profile when an experiment was performed to produce a Group III nitride semiconductor single crystal.

FIG. 6 is a graph showing the temperature profiles for growing a semiconductor single crystal. In the line L1, the temperature of the crucible 1260 is within the first temperature range J1 during the first period K1. The temperature of the crucible 1260 is elevated after the temperature entered the first temperature range J1 and the first period K1 passed. In this case, the reaction of Ga with Na was started when the temperature of the crucible 1260 is around 100° C. Ga and Na were reacted and sufficiently dispersed. That is, it seems that fine particles of the alloy of Ga and Na are efficiently dispersed. A single crystal CR1 was grown over the entire surface of the template 10.

In the line L2 of FIG. 6, the temperature of the crucible 1260 rises more steeply than in the line L1. The period for which the temperature of the crucible 1260 is within the first temperature range J1, is shorter than in the line L1. However, when the temperature is within a range of 200° C. to 300° C., the temperature rise of the crucible 1260 is gentle. In this case, Ga was not sufficiently reacted with Na. A single crystal CR1 was hardly grown on the template 10.

In the line L3 of FIG. 3, the temperature of the crucible 1260 rises more steeply than in the line L1. The period for which the temperature of the crucible 1260 is within the first temperature range J1, is shorter than in the line L1. In this case, Ga was not sufficiently reacted with Na. A single crystal CR1 was hardly grown on the template 10.

Therefore, it is considered important to gradually elevate the temperature of the crucible 1260 within the first temperature range J1, thereby enabling the sufficient reaction of Ga with Na. To uniformly grow a single crystal CR1 over the entire surface of the template 10, it is considered important to sufficiently disperse the reacted Ga and Na, i.e., fine particles of the alloy of Ga and Na.

Figure 7:
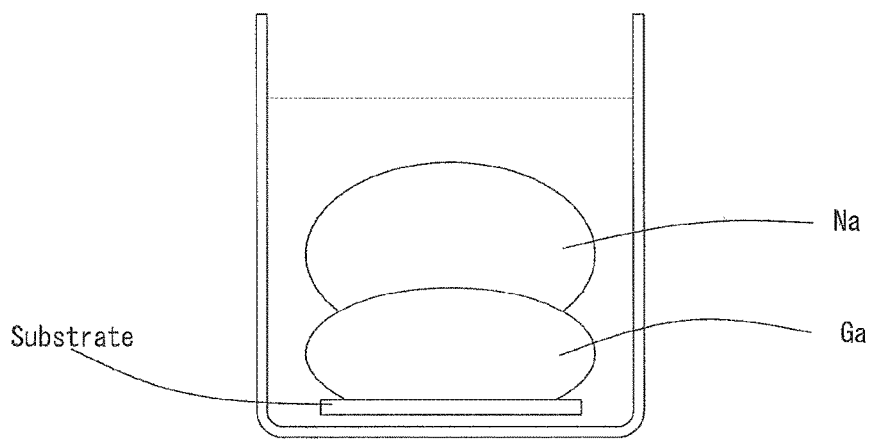
FIG. 7 is a sketch showing Ga and Na in the crucible in the method for producing a Group III nitride semiconductor single crystal in the Embodiment (part 1)

The X-ray image obtained by the X-ray receiving unit 1500 will next be described. FIG. 7 is the X-ray image of the crucible 1260 just after the temperature rise. At this stage, both Ga and Na do not melt. Therefore, in FIG. 7, Na is placed on Ga.

Figure 8:
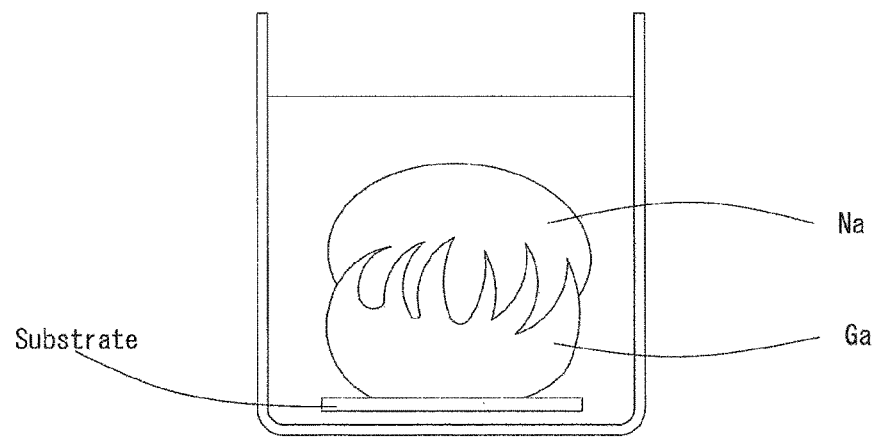
FIG. 8 is a sketch showing Ga and Na in the crucible in the method for producing a Group III nitride semiconductor single crystal in the Embodiment (part 2)

FIG. 8 is the X-ray image of the crucible 1260 when the temperature of the crucible 1260 is in the vicinity of 100° C.

The melting point of Na is about 97.7° C. The melting point of Ga is about 29.8° C. Therefore, in the vicinity of 100° C., Na starts to melt, and Ga is reacted with Na. In FIG. 8, Ga is being mixed with Na.

Figure 9:
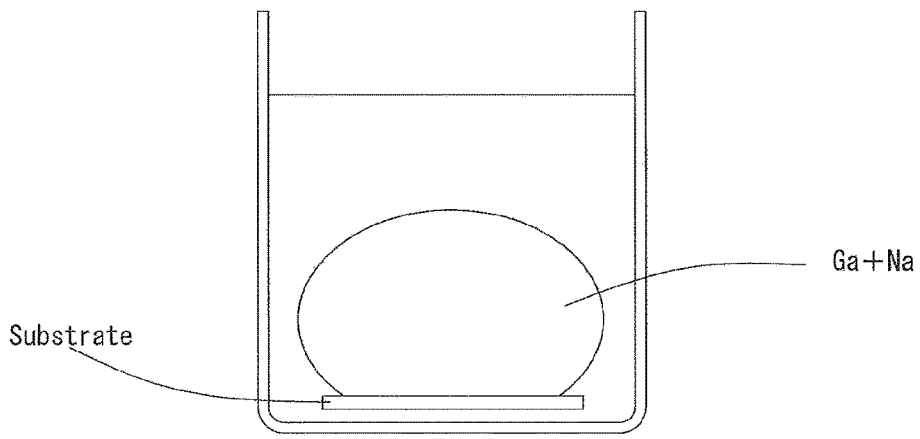
FIG. 9 is a sketch showing Ga and Na in the crucible in the method for producing a Group III nitride semiconductor single crystal in the Embodiment (part 3)

In FIG. 9, Ga is reacted with Na on the template 10. Fine particles of Ga—Na alloy obtained through this reaction are uniformly disposed on the template 10. When the reaction of Ga and Na proceeds to this stage, a single crystal CR1 is uniformly grown. On the other hand, the reaction is stopped at the stage of FIG. 7, a single crystal CR1 is not grown.

The results of the experiment show that when the temperature profile (line L1) of FIG. 6 was used, the reaction of Ga and Na proceeded to the state shown in FIG. 9, and a single crystal CR1 was uniformly produced. When the temperature profiles (line L2 and line L3) of FIG. 6 were used, the reaction of Ga and Na was stopped at the state shown in FIG. 7, and a single crystal CR1 was not produced.

8. Variation 8-1. Temperature Control

In Embodiment 1, after it was observed that the mixture of Ga and Na was completed in the X-ray images obtained by the X-ray receiving unit 1500, the temperature of the crucible 1260 is elevated up to the growth temperature of the semiconductor single crystal. During the first period K1, the temperature of the crucible 1260 is adjusted to fall within the first temperature range J1. After the first period K1 passes, the temperature of the crucible 1260 may be elevated up to the growth temperature.

In differential thermal analysis, when a difference between the reference temperature value and the measured temperature value is integrated with time, and the integrated value exceeds a predetermined integrated reference value, the reaction of Ga with Na may be determined to be completed. In this case, the reaction determination unit 1700 performs integral calculation and determines whether the reaction was completed. After that, the temperature of the crucible 1260 is elevated up to the growth temperature.

8-2. Group III Nitride Semiconductor Single Crystal

In Embodiment 1, a GaN semiconductor single crystal was formed. However, the production method may be applied to the growth of other Group III nitride semiconductor single crystals. For example, $Al_X In_Y Ga_{(1-X-Y)}N (0 \leq X, 0 \leq Y, X+Y \leq 1)$ may be produced. In this case, additional raw material(s) must be added into the crucible 1260.

8-3. Growth of a Plurality of Semiconductor Single Crystals

In Embodiment 1, one semiconductor single crystal was grown by means of a single crucible. However, a plurality of semiconductor single crystals may also be produced by means of a single crucible having a large diameter, leading to enhancement of productivity.

8-4. Rotational Mode

The rotational mode of the crucible 1260 is not necessarily limited to the one shown in FIG. 4. Other rotational mode may be employed.

9. Summary of the Embodiment

As described hereinabove, in Embodiment 1; i.e., the method for producing a Group III nitride semiconductor single crystal, a semiconductor single crystal is grown by a flux process. The temperature of the crucible 1260 is adjusted to fall within the first temperature range J1 during the first period K1. The temperature of the crucible 1260 is gradually elevated during the first period K1, Ga was sufficiently reacted with Na. The measuring device detects the reaction of Ga with Na. The reacted Ga and Na are sufficiently dispersed. Thus, a single crystal CR1 can be uniformly grown over the entire surface of the seed crystal substrate. Therefore, the semiconductor single crystal has high yield in the method for producing a Group III nitride semiconductor single crystal.

Note that Embodiment 1 is given solely for the purpose of illustration. Needless to say, those skilled in the art may change or modify the embodiment without departing from the spirit thereof. For example, in Embodiment 1, the buffer layer 12 and the GaN layer 13 were formed on the template 10 through metal-organic chemical vapor deposition (MOCVD). However, a vapor phase growth technique such as hydride vapor phase epitaxy (HVPE), a physical method such as molecular-beam epitaxy (MBE), and other, similar techniques may also be employed.

Embodiment 2

The present techniques are based on the discovery that when the growth temperature is elevated up to a growth temperature for growing Group III nitride semiconductor after the reaction of Na with Ga was achieved at a temperature lower than the growth temperature, a high quality and uniform crystal is obtained. The reaction of Na with Ga is a state of a dispersion of fine particles of Ga—Na alloy. When Ga—Na alloy becomes liquid in a process of temperature rise after the state of a dispersion of fine particles of Ga—Na alloy was achieved and the temperature is elevated up to the growth temperature for growing Group III nitride semiconductor single crystal, a flat high-quality crystal is obtained. In Embodiment 1, a state of a dispersion of fine particles of Ga—Na alloy is detected using X-ray or in differential thermal analysis.

Thus, if the state of a dispersion of fine particles of Ga—Na alloys is achieved before the crystal growth, the object of the present techniques can be attained. The relationship between the temperature rise profile shown in FIGS. 5 and 6 and the state of a dispersion of Ga—Na alloy detected using X-ray can be stored through experiments. From the results, the state of a dispersion of Ga—Na alloy can be achieved only by the optimum temperature rise profile. That is, the state of a dispersion of Ga—Na alloy can be achieved by the temperature rise profile or the time period for which the temperature of the melt is within a predetermined low temperature range lower than the growth temperature.

Embodiment 2 is an example that the reaction of Ga with Na is completed in the first temperature range only by controlling the temperature before Group III nitride semiconductor is grown at the growth temperature.

Figure 10:
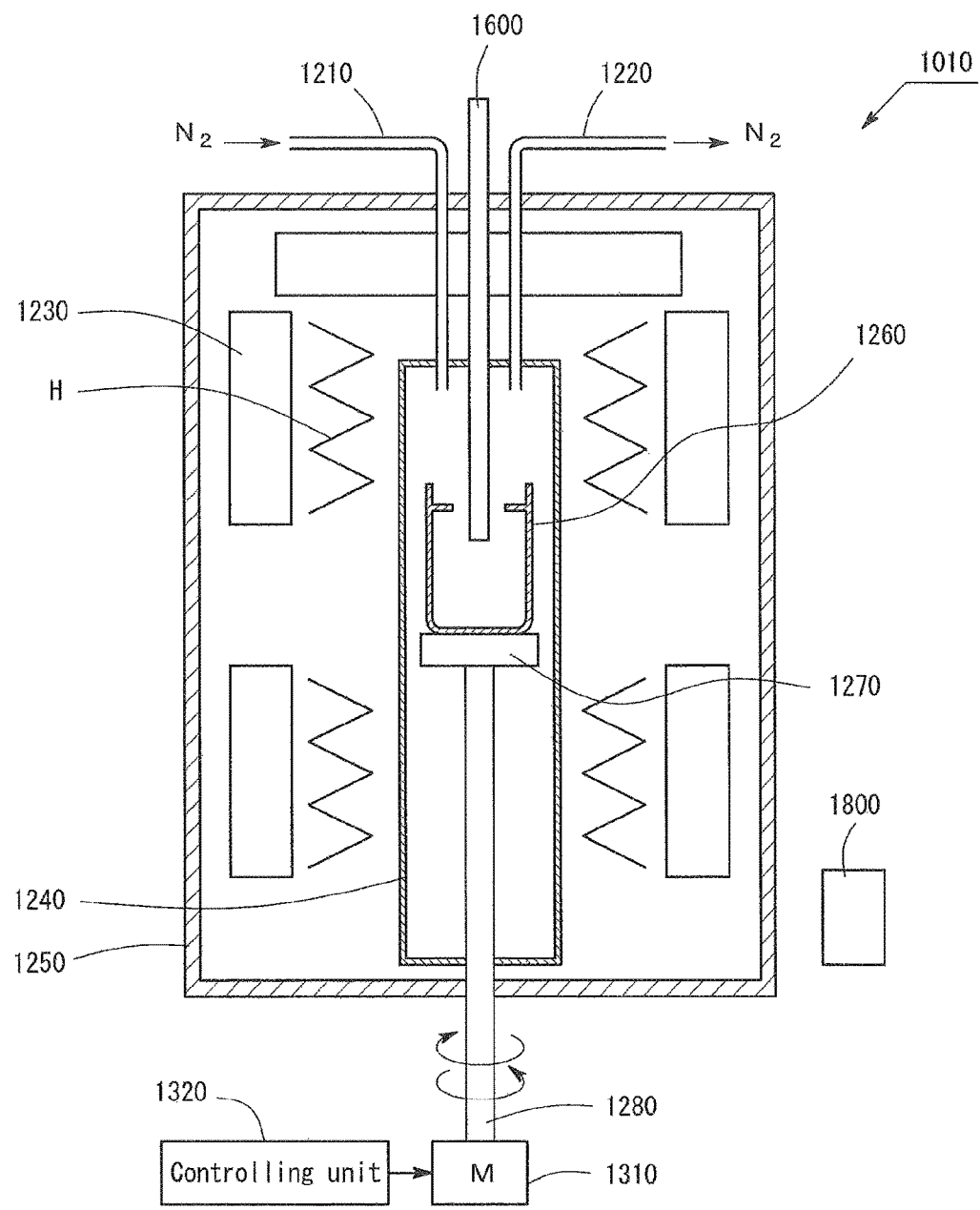
FIG. 10 is a schematic view illustrating the structure of a crystal growth apparatus used in the method for producing a Group III nitride semiconductor single crystal of Embodiment 2.

FIG. 10 shows a crystal growth apparatus 1010 of Embodiment 2. The crystal growth apparatus 1010 differs from the crystal growth apparatus 1000 shown in FIG. 2 only in that the pressure container 1250 is an integrated type without being separated into the upper and lower parts, and there is not a X-ray irradiation unit 1400, a X-ray receiving unit 1500, and a reaction determination unit 1700.

In Embodiment 2, after the temperature of the reaction chamber 1240 was maintained at 95° C. while evacuating, the crucible 1260 containing the raw materials was placed in the reaction chamber 1240. Subsequently, the pressure of the reaction chamber 1240 was adjusted to 30 pa in two and a half hours. That is, the temperature of the crucible 1260 was maintained at 95° C. for two and a half hours (period K1) as shown in the curve L4 of FIGS. 5 and 6. Thereafter, the temperature was elevated up to the growth temperature at a temperature rise rate of 10° C./min., and crystal was grown at the growth temperature.

In FIG. 6, when the temperature of the material, i.e., melt, was elevated up to the growth temperature under the temperature profiles L2 and L3 passing the low temperature range of 80° C. to 200° C. in a short time, a high-quality and uniform crystal is not obtained. That is, a low temperature state for at least a certain time is required to achieve a state of a dispersion of fine particles of Ga—Na alloy. When passing the low temperature state at a high speed, a state of a dispersion of fine particles of Ga—Na alloy is not achieved even if the melt is maintained at a temperature higher than the temperature range or the growth temperature, resulting in a separation of Ga and Na.

On the contrary, when the temperature is elevated up to the growth temperature under the temperature profile L1 or L4 passing the above temperature range for a long time, a high-quality and uniform semiconductor crystal is obtained. When the time period for passing the low temperature range is 30 minutes or more in the temperature rise profile of the melt, a state of a dispersion of fine particles of Ga—Na alloy is achieved. After the state of a dispersion of fine particles of Ga—Na alloy is completed, no additional time period for passing the low temperature range is required. There is no problem if the time period for passing the low temperature range is lengthened. However, longer production time is not preferable. Generally, the time period for which a low temperature range is added, is thirty minutes to three hours. When the time period is too long, the dissolved amount of nitrogen is reduced, and the melt-back of the seed crystal is increased, thereby deteriorating the quality of the semiconductor crystal.

In the temperature rise profile of the melt, the time period K1 for which the temperature of the melt is within the low temperature range of 80° C. to 200° C. is preferably a predetermined value. The temperature rise may be stopped and maintained in the low temperature range. The time period K1 for which the temperature of the melt is within the low temperature range of 80° C. to 200° C. may be controlled by lowering the temperature rise rate from a room temperature to 200° C. than the temperature rise rate from 200° C. to the growth temperature. The temperature rise rate from a room temperature to 200° C. is preferably less than or equal to 10° C./min. The temperature rise rate from 200° C. to the growth temperature is preferably 5° C./min. to 20° C./min. In the temperature profiles L1 and L4 in FIG. 6, the temperature rise rate is changed in two steps. However, it may be changed in multiple steps. For example, the temperature may be held at 95° C., 150° C., 200° C. and 250° C. for 30 minutes, respectively, in the temperature rising process at the rise rate 10° C./min. The hold time may be different at the respective hold temperatures.

In FIGS. 5 and 6, when the time for passing the temperature range of less than or equal to 400° C. is 30 minutes or more, a state is achieved in which fine particles of Ga—Na alloy are uniformly dispersed in the melt. This alloy becomes liquid at 400° C. When the Ga—Na alloy became liquid in a process of temperature rise up to the growth temperature after a state was achieved in which a large amount of fine particles of Ga—Na alloy was uniformly dispersed, the crystallinity of growing semiconductor is improved. The present inventions are based on the discovery that high quality crystal is obtained by growing semiconductor at a growth temperature after a state was achieved in which a large amount of fine particles of Ga—Na alloy was uniformly dispersed before liquid Ga—Na alloy is obtained. Therefore, in general, the temperature range lower than 500° C. must be maintained for a long time to achieve a state of a dispersion of fine particles of Ga—Na alloy.

Embodiment 3

Embodiments 1 and 2 are directed to a method for producing a Group III nitride semiconductor single crystal. Embodiment 3 is directed to a semiconductor device employing the Group III nitride semiconductor single crystal as a self-standing substrate.

1. Vertical-type Semiconductor Device

Figure 11:
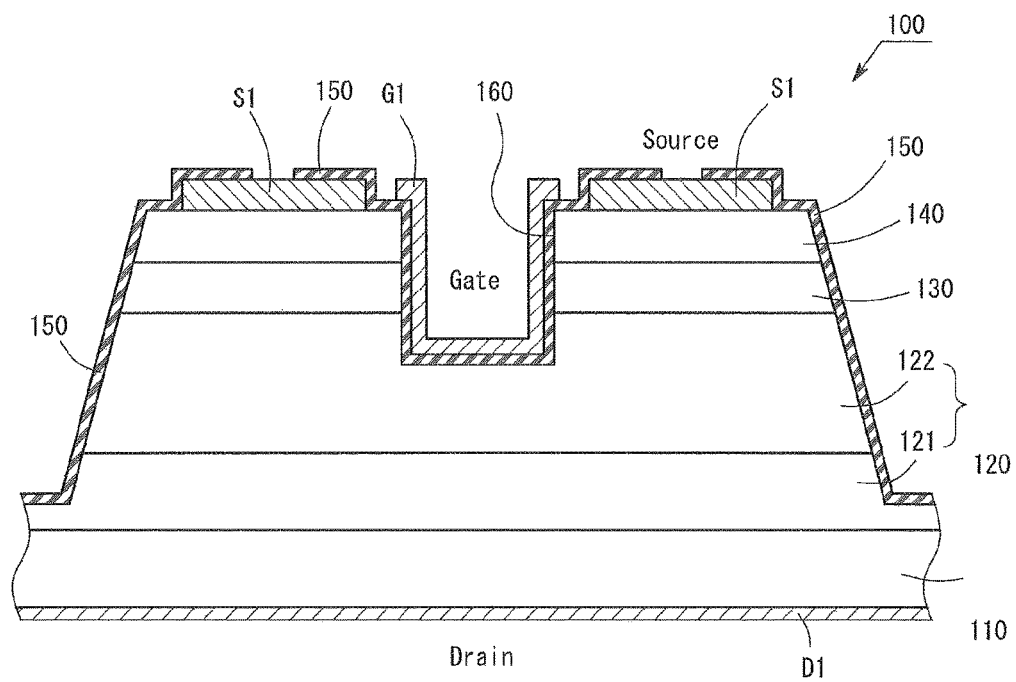
FIG. 11 is a schematic view illustrating the structure of a vertical-type semiconductor device of Embodiment 3.

FIG. 11 shows a power device 100 according to Embodiment 2. The power device 100 is a vertical-type semiconductor device. The power device 100 has a drain electrode D1 as shown at the bottom of FIG. 11, and a gate electrode G1 and a source electrode S1 as shown at the top of FIG. 11.

The power device 100 has a plurality of Group III nitride semiconductor layers. As shown in FIG. 11, in addition to the aforementioned electrodes, the power device 100 has a substrate 110, an n-type layer 120, a p-type layer 130, an n-type layer 140, and an insulating film 150. The n-type layer 120 has an n$^+$GaN layer 121 and an n$^-$GaN layer 122, which are sequentially deposited on the substrate 110. A source electrode S1 is in contact with the n-type layer 140, and a drain electrode D1 is in contact with the substrate 110.

2. Self-standing Substrate

The substrate 110 is a self-standing substrate produced from the crystal CR of Embodiments 1 and 2. As used herein, the term "self-standing substrate" encompasses a disk-shape substrate (wafer), a substrate obtained after device isolation, etc. A sapphire substrate 11 and other parts are removed from the crystal CR. The removal may be performed through a known technique such as laser lift-off. Both surfaces of the thus-obtained single crystal CR1 are polished or subjected to a similar treatment, to thereby obtain the substrate 110. The substrate 110 may be provided with embossment or other shapes. Alternatively, instead of polishing both sides, at least one surface of the single crystal CR1 may be polished. The substrate 110 may be peeled using thermal strain during cooling after the crystal growth process.

3. Variation
3-1. Lateral-type semiconductor device

Figure 12:
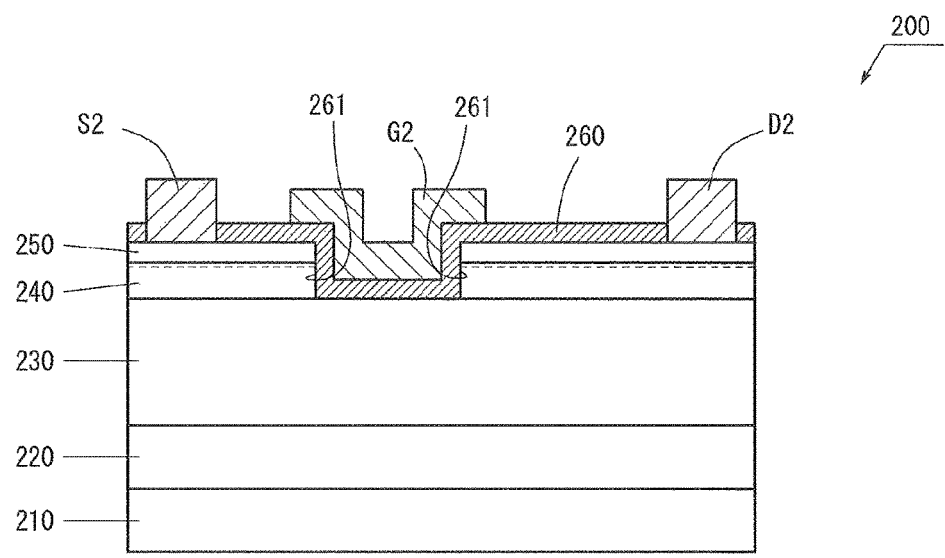
FIG. 12 is a schematic view illustrating the structure of a lateral-type semiconductor device of Embodiment 3.

Embodiment 2 is directed to a vertical-type semiconductor device. However, the self-standing substrate of Embodiment 2 may be applied to a lateral-type semiconductor device 200 shown in FIG. 12. The semiconductor device 200 shown in FIG. 12 is an HFET. The semiconductor device 200 has a substrate 210, a buffer layer 220, a first carrier travel layer 230, a second carrier travel layer 240, a carrier supply layer 250, an insulating film 260, a drain electrode D2, a source electrode S2, and a gate electrode G2. The substrate 210 was obtained through working the single crystal CR1.

3-2. Semiconductor Light-emitting Device

Figure 13:
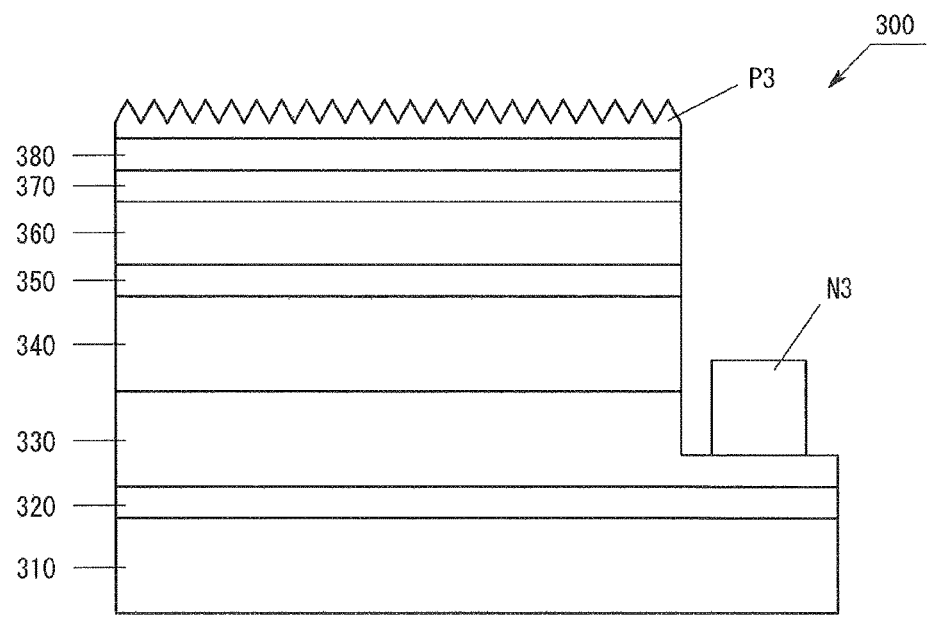
FIG. 13 is a schematic view illustrating the structure of a semiconductor light-emitting device of Embodiment 3.

Alternatively, the self-standing substrate of Embodiment 2 may be applied to a semiconductor light-emitting device 300 shown in FIG. 13. As described above, the single crystal CR1 obtained through the production method of Embodiments 1 and 2 may be applied to a variety of semiconductor devices. The semiconductor light-emitting device 300 has a substrate 310, a semiconductor layer, a p-electrode P3, and an n-electrode N3. The substrate 310 was obtained through working the single crystal CR1.

The semiconductor layer is composed of a buffer layer 320, an n-type contact layer 330, an n-type electrostatic breakdown preventing layer 340, an n-type cladding layer 350, a light-emitting layer 360, a p-type cladding layer 370, and a p-type contact layer 380, which have been sequentially formed on the main surface of the substrate 310. The p-electrode P3 is in contact with the p-type contact layer 380, and the n-electrode N3 is in contact with the n-type contact layer 330.

What is claimed is:

1. A method for producing a Group III nitride semiconductor single crystal, the method comprising:
    adding a seed-crystal substrate, Ga, and Na into a crucible and growing a Group III nitride semiconductor single crystal,
    wherein in the growing of the Group III nitride semiconductor single crystal at a predetermined growth temperature:
        Ga is reacted with Na with the temperature of the crucible adjusted within a first temperature range lower than 500° C.; and
        the temperature of the crucible is elevated up to the growth temperature of the Group III nitride semiconductor single crystal after the reaction of Ga with Na, and
    wherein the reaction of Ga with Na is detected by a measuring device for detecting the reaction of Ga with Na.

2. The method for producing a Group III nitride semiconductor single crystal according to claim 1, wherein the reaction of Ga with Na is a state of a dispersion of fine particles of Ga—Na alloy.

3. The method for producing a Group III nitride semiconductor single crystal according to claim 1, wherein the first temperature range is 80° C. to 400° C.

4. The method for producing a Group III nitride semiconductor single crystal according to claim 2, wherein the first temperature range is 80° C. to 400° C.

5. The method for producing a Group III nitride semiconductor single crystal according to claim 1, wherein the first temperature range is 80° C. to 200° C.

6. The method for producing a Group III nitride semiconductor single crystal according to claim 2, wherein the first temperature range is 80° C. to 200° C.

7. The method for producing a Group III nitride semiconductor single crystal according to claim 1, wherein the measuring device is a X-ray observation device which observes the inside of the crucible by transmitting X-ray to the crucible, and detects the reaction of Ga with Na by receiving the X-ray transmitted through the crucible.

8. The method for producing a Group III nitride semiconductor single crystal according to claim 1, wherein the measuring device has a temperature measuring unit which measures the inside temperature of the crucible, and detects the reaction of Ga with Na in differential thermal analysis.

9. A method for producing a Group III nitride semiconductor single crystal, the method comprising:
    adding a seed-crystal substrate, Ga, and Na into a crucible and growing a Group III nitride semiconductor single crystal,
    wherein in the growing of the Group III nitride semiconductor single crystal at a predetermined growth temperature:
        Ga is reacted with Na with the temperature of the crucible adjusted within a first temperature range of not lower than 80° C. and lower than 200° C.; and
        the temperature of the crucible is elevated up to the growth temperature of the Group III nitride semiconductor single crystal after the reaction of Ga with Na, and
    wherein in a process for rising the temperature of the crucible from a room temperature to a growth temperature before a process of the growing of the Group III nitride semiconductor single crystal, a temperature rise profile of the crucible is adjusted so as to fall within the first temperature range for at least 30 minutes.

10. A method for producing a Group III nitride semiconductor single crystal, the method comprising:
    adding a seed-crystal substrate, Ga, and Na into a crucible and growing a Group III nitride semiconductor single crystal,
    wherein in the growing of the Group III nitride semiconductor single crystal at a predetermined growth temperature:
        Ga is reacted with Na with the temperature of the crucible adjusted within a first temperature range lower than 500° C.; and
        the temperature of the crucible is elevated up to the growth temperature of the Group III nitride semiconductor single crystal after the reaction of Ga with Na, and
    wherein the temperature rise rate at which the temperature of the crucible is elevated from a room temperature to a temperature when the reaction of Ga and Na is completed is lower than the temperature rise rate at which the temperature of the crucible is elevated up to the growth temperature after the reaction.

11. The method for producing a Group III nitride semiconductor single crystal according to claims 10, wherein the reaction of Ga with Na is a state of a dispersion of fine particles of Ga—Na alloy.

12. The method for producing a Group III nitride semiconductor single crystal according to claims 10, wherein the first temperature range is 80° C. to 200° C.

13. The method for producing a Group III nitride semiconductor single crystal according to claim 9, wherein the reaction of Ga with Na is a state of a dispersion of fine particles of Ga—Na alloy.

14. The method for producing a Group III nitride semiconductor single crystal according to claim 7, wherein the reaction of Ga with Na is a state of a dispersion of fine particles of Ga—Na alloy.

15. The method for producing a Group III nitride semiconductor single crystal according to claim 8, wherein the reaction of Ga with Na is a state of a dispersion of fine particles of Ga—Na alloy.

16. The method for producing a Group III nitride semiconductor single crystal according to claim 12, wherein the reaction of Ga with Na is a state of a dispersion of fine particles of Ga—Na alloy.

* * * * *